United States Patent
Nakanishi et al.

(10) Patent No.: US 7,524,563 B2
(45) Date of Patent: Apr. 28, 2009

(54) FLAME RETARDANT ADHESIVE COMPOSITION, AND ADHESIVE SHEET, COVERLAY FILM AND FLEXIBLE COPPER-CLAD LAMINATE USING SAME

(75) Inventors: Toru Nakanishi, Setagaya-ku (JP); Kazunori Kondo, Kamisu (JP); Shigehiro Hoshida, Narita (JP); Tadashi Amano, Kamisu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 273 days.

(21) Appl. No.: 11/401,870

(22) Filed: Apr. 12, 2006

(65) Prior Publication Data

US 2006/0234044 A1 Oct. 19, 2006

(30) Foreign Application Priority Data

Apr. 13, 2005 (JP) ............................... 2005-116093
May 9, 2005 (JP) ............................... 2005-136665

(51) Int. Cl.
- B32B 27/38 (2006.01)
- B32B 37/12 (2006.01)
- C08L 63/00 (2006.01)
- C09J 163/00 (2006.01)

(52) U.S. Cl. ........................ 428/416; 428/413; 428/414; 428/418; 428/473.5; 523/451; 525/523; 156/330

(58) Field of Classification Search .................. 428/413, 428/414, 416, 418, 473.5; 523/451; 525/92 H, 525/438, 523, 524, 529, 530, 531, 532, 533; 427/386; 156/330
See application file for complete search history.

(56) References Cited

U.S. PATENT DOCUMENTS

| | | | | |
|---|---|---|---|---|
| 5,623,003 A * | 4/1997 | Tanaka | ........................ | 523/428 |
| 2005/0196619 A1 | 9/2005 | Nakanishi et al. | | |
| 2006/0234043 A1 | 10/2006 | Nakanishi et al. | | |
| 2006/0234044 A1 | 10/2006 | Nakanishi et al. | | |
| 2006/0234045 A1 | 10/2006 | Nakanishi et al. | | |
| 2006/0264538 A1 | 11/2006 | Nakanishi et al. | | |
| 2008/0090075 A1 | 4/2008 | Kondo et al. | | |

FOREIGN PATENT DOCUMENTS

| | | |
|---|---|---|
| JP | 2001-339131 | 12/2001 |
| JP | 2001-339132 | 12/2001 |

OTHER PUBLICATIONS

U.S. Appl. No. 11/865,330, filed Oct. 1, 2007, Kondo et al.

* cited by examiner

Primary Examiner—Michael J Feely
(74) Attorney, Agent, or Firm—Oblon, Spivak, McClelland, Maier & Neustadt, P.C.

(57) ABSTRACT

Provided is a flame retardant adhesive composition including (A) a halogen-free epoxy resin, (B) a thermoplastic resin and/or a synthetic rubber, (C) a curing agent, (D) a phytate compound, and (E) a curing accelerator. Also provided are an adhesive sheet having a layer including the above composition, and a protective layer for covering the layer including the composition; a coverlay film having an electrically insulating film, and a layer including the above composition provided on top of the film; and a flexible copper-clad laminate having an electrically insulating film, a layer including the above composition provided on top of the film, and copper foil. Further provided are a process for producing the adhesive sheet, a process for producing the coverlay film, and a process for producing the flexible copper-clad laminate. The halogen-free adhesive composition yields a cured product, on curing, that exhibits excellent flame retardancy and electrical characteristics (anti-migration properties). The composition can be used for producing an adhesive sheet, a coverlay film, and a flexible copper-clad laminate.

22 Claims, No Drawings

FLAME RETARDANT ADHESIVE COMPOSITION, AND ADHESIVE SHEET, COVERLAY FILM AND FLEXIBLE COPPER-CLAD LAMINATE USING SAME

CROSS-REFERENCE TO RELATED APPLICATIONS

This application claims priority to Japanese Patent Application Nos. 2005-116093, filed Apr. 13, 2008 and 2005-136665, filed May 9, 2008.

BACKGROUND OF THE INVENTION

1. Field of the Invention

The present invention relates to an adhesive composition that is halogen-free and yields a cured product, on curing, that exhibits excellent flame retardancy, and also relates to an adhesive sheet, a coverlay film, and a flexible copper-clad laminate that use such a composition.

2. Description of the Prior Art

Conventionally, the adhesives used in electronic materials such as semiconductor sealing materials and glass epoxy-based copper-clad laminates have included a bromine-containing epoxy resin or phenoxy resin or the like in order to ensure a superior level of flame retardancy. However, because compounds containing halogens such as bromine release toxic gases such as dioxin-based compounds when combusted, in recent years, the use of halogen-free materials in adhesives has been keenly investigated.

On the other hand, flexible copper-clad laminates, which are thinner than the glass epoxy-based copper-clad laminates mentioned above, and offer additional flexibility, are now being widely used, and the size of this market continues to expand as electronic materials become thinner, and move to even higher density packaging. Flexible copper-clad laminates are copper-clad laminates with improved flexibility, which are produced by bonding a polyimide film and a copper foil together with an adhesive, and then heating and curing the adhesive. In a similar manner to the adhesives used in the electronic materials described above, the use of halogen-free materials in the adhesives used in these flexible copper-clad laminates is also being investigated.

Furthermore, once the copper foil of a flexible copper-clad laminate has been processed to form a wiring pattern, an electrically insulating film (a coverlay film) such as a polyimide film coated with an adhesive film is used to cover the surface on which the wiring pattern has been formed, thereby protecting the wiring. The properties required for the materials for these flexible copper-clad laminates and coverlay films include favorable adhesion between the electrically insulating film and the copper foil, as well as favorable heat resistance, solvent resistance, electrical characteristics (anti-migration properties), dimensional stability, storage stability, and flame retardancy. In addition, when flexible printed wiring boards prepared by crimping a coverlay film are bonded together to form multilayered structures with increased density, the adhesive films (adhesive sheets) used for bonding the boards together require the same characteristics as those required by flexible copper-clad laminates and coverlay films.

Examples of known materials that satisfy the above requirements include adhesive compositions comprising an epoxy resin, an aromatic phosphate ester, a curing agent, and a high-purity acrylonitrile butadiene rubber, as well as flexible copper-clad laminates and coverlays that use such adhesive compositions (see patent reference 1), but high-purity acrylonitrile butadiene rubber is extremely expensive, meaning that with the exception of certain special applications, large-scale use of this material is impossible. In addition, adhesive compositions comprising an epoxy resin, an aromatic phosphate ester, a nitrogen-containing phenol novolac resin, and a normal purity acrylonitrile butadiene rubber, as well as flexible copper-clad laminates and coverlays that use such adhesive compositions, are also known (see patent reference 2), but because these materials use normal purity acrylonitrile butadiene rubber, the anti-migration properties tend to deteriorate.

[Patent Reference 1] JP 2001-339131A
[Patent Reference 2] JP 2001-339132A

SUMMARY OF THE INVENTION

An object of the present invention is to provide a halogen-free adhesive composition that yields a cured product, on curing, that exhibits excellent flame retardancy and electrical characteristics (anti-migration properties), as well as an adhesive sheet, a coverlay film, and a flexible copper-clad laminate that use such a composition.

In order to achieve this object, the present invention provides a flame retardant adhesive composition comprising:
(A) a halogen-free epoxy resin,
(B) a thermoplastic resin and/or a synthetic rubber,
(C) a curing agent,
(D) a phytate compound, and
(E) a curing accelerator.

A second aspect of the present invention provides an adhesive sheet, having a layer comprising the above composition, and a protective layer for covering the layer comprising the composition.

A third aspect of the present invention provides a coverlay film, having an electrically insulating film, and a layer comprising the above composition provided on top of the film.

A fourth aspect of the present invention provides a flexible copper-clad laminate, having an electrically insulating film, a layer comprising the above composition provided on top of the film, and copper foil.

A fifth aspect of the present invention provides a process for producing an adhesive sheet, having a layer comprising the above composition, and a protective layer for covering said layer comprising said composition, said process comprising the steps of:
applying to a protective layer a dispersion comprising said composition and an organic solvent,
removing said organic solvent to dry said composition,
crimping and laminating said protective layer to another protective layer, thereby forming said adhesive sheet.

A sixth aspect of the present invention provides a process for producing a coverlay film, having an electrically insulating film, and a layer comprising the above composition provided on top of said film, said process comprising the steps of:
applying to an electrically insulating film a dispersion comprising said composition and an organic solvent,
removing said organic solvent to dry said composition,
crimping and laminating said electrically insulating film to a protective layer, thereby forming said coverlay film.

A seventh aspect of the present invention provides a process for producing a flexible copper-clad laminate, having an electrically insulating film, a layer comprising the above composition provided on top of said film, and copper foil, said process comprising the steps of:
applying to an electrically insulating film a dispersion comprising said composition and an organic solvent,
removing said organic solvent to dry said composition, laminating said electrically insulating film to a copper foil, thereby forming said flexible copper-clad laminate.

A composition of the present invention yields a cured product, on curing, that exhibits excellent flame retardancy, peel strength, electrical characteristics (anti-migration properties) and solder heat resistance, and is also halogen-free. Accordingly, adhesive sheets, coverlay films, and flexible copper-clad laminates prepared using this composition also exhibit excellent flame retardancy, peel strength, electrical characteristics (anti-migration properties), and solder heat resistance.

DETAILED DESCRIPTION OF THE PREFERRED EMBODIMENTS

<Flame Retardant Adhesive Composition>

As follows is a detailed description of the various components of a flame retardant adhesive composition of the present invention. In this description, room temperature refers to a temperature of 25° C. Furthermore, glass transition temperatures (Tg) refer to glass transition temperatures measured using the DMA method.

[Halogen-Free Epoxy Resin (A)]

A halogen-free epoxy resin of the component (A) is an epoxy resin that contains no halogen atoms such as bromine within the molecular structure, and preferably contains an average of at least 2 epoxy groups within each molecule. There are no particular restrictions on this epoxy resin, which may also incorporate silicone, urethane, polyimide, or polyamide structures or the like within the skeleton. Furthermore, the skeleton may also incorporate phosphorus atoms, sulfur atoms, or nitrogen atoms or the like.

Specific examples of this epoxy resin include bisphenol A epoxy resins, bisphenol F epoxy resins, and hydrogenated products thereof; glycidyl ether based epoxy resins such as phenol novolac epoxy resins and cresol novolac epoxy resins; glycidyl ester based epoxy resins such as glycidyl hexahydrophthalate and dimer acid glycidyl ester; glycidyl amine based epoxy resins such as triglycidyl isocyanurate and tetraglycidyldiaminodiphenylmethane; and linear aliphatic epoxy resins such as epoxidated polybutadiene and epoxidated soybean oil, and of these, bisphenol A epoxy resins, bisphenol F epoxy resins, phenol novolac epoxy resins, and cresol novolac epoxy resins are preferred. Examples of commercially available products of these resins include the brand names Epikote 828 (manufactured by Japan Epoxy Resins Co., Ltd., number of epoxy groups per molecule: 2), Epiclon 830S (manufactured by Dainippon Ink and Chemicals, Incorporated, number of epoxy groups per molecule: 2), and Epikote 517 (manufactured by Japan Epoxy Resins Co., Ltd., number of epoxy groups per molecule: 2), as well as epoxy resins with weight average molecular weights of 1,000 or greater, including EOCN103S (manufactured by Nippon Kayaku Co., Ltd., number of epoxy groups per molecule: at least 2) and YL7175-1000 (manufactured by Japan Epoxy Resins Co., Ltd., number of epoxy groups per molecule: 2).

Furthermore, the various phosphorus-containing epoxy resins, produced by bonding phosphorus atoms to the above epoxy resin using a reactive phosphorus compound, can also be used effectively in forming halogen-free flame retardant adhesive compositions. Examples of this reactive phosphorus compound include 9,10-dihydro-9-oxa-10-phosphaphenanthrene-10-oxide (brand name: HCA, manufactured by Sanko Co., Ltd.), and a compound in which the active hydrogen atom bonded to the phosphorus atom of this compound has been substituted with hydroquinone (brand name: HCA-HQ, manufactured by Sanko Co., Ltd.). Examples of commercially available products of the resulting phosphorus-containing epoxy resins include the brand names FX305 (manufactured by Tohto Kasei Co., Ltd., phosphorus content: 3%, number of epoxy groups per molecule: at least 2), and Epiclon EXA9710 (manufactured by Dainippon Ink and Chemicals, Incorporated, phosphorus content: 3%, number of epoxy groups per molecule: at least 2).

These halogen-free epoxy resins of the component (A) can be used either alone, or in combinations of two or more different resins.

[Thermoplastic Resin/Synthetic Rubber (B)]

Thermoplastic Resin

Thermoplastic resins that can be used as the component (B) are typically polymer compounds with a glass transition temperature (Tg) of room temperature (25° C.) or higher. The weight average molecular weight of the resin is typically within a range from 1,000 to 5,000,000, and preferably from 5,000 to 1,000,000. There are no particular restrictions on the type of thermoplastic resin used, and suitable examples include polyester resins, acrylic resins, phenoxy resins, and polyamideimide resins, and of these, those resins that incorporate carboxyl groups are preferred. If the resin incorporates carboxyl groups, then in those cases where the product composition is used within a coverlay film, the adhesive exhibits a favorable level of fluidity (flow characteristics) during the heat press treatment used to form an integrated laminate. This fluidity of the adhesive enables the adhesive to cover and protect the copper foil portion (the wiring pattern) that forms the circuit on the surface of the flexible copper-clad laminate with no gaps. Furthermore, such fluidity is also effective in improving the adhesion between the copper foil and the electrically insulating film comprising a polyimide film or the like.

There are no particular restrictions on the carboxyl group content within the type of carboxyl group-containing thermoplastic resin described above, although proportions within a range from 1 to 10% by mass are preferred, and proportions from 2 to 6% by mass are even more desirable. If this proportion falls within this range from 1 to 10% by mass, then the flow characteristics and the solder heat resistance are even more superior when the product composition is used within a coverlay film, and the stability of the adhesive composition is also superior.

Examples of commercially available carboxyl group-containing thermoplastic resins, listed in terms of their brand names, include the Vylon series (carboxyl group-containing polyester resins, manufactured by Toyobo Co., Ltd.), 03-72-23 (a carboxyl group-containing acrylic resin, manufactured by Kyodo Chemical Co., Ltd.), SG-708-6T (a carboxyl group-containing acrylic resin, manufactured by Nagase ChemteX Corporation), and the KS series (epoxy group-containing acrylic resins, manufactured by Hitachi Chemical Co., Ltd.).

Examples of other commercially available thermoplastic resins, listed in terms of their brand names, include the YP series and ERF series (phenoxy resins, manufactured by Tohto Kasei Co., Ltd.), Epikote 1256 (a phenoxy resin, manufactured by Japan Epoxy Resins Co., Ltd.), the Vylomax series (polyamideimide resins, manufactured by Toyobo Co., Ltd.), and the Kayaflex series (polyamideimide resins, manufactured by Nippon Kayaku Co., Ltd.

Next is a description of the characteristics of each of the thermoplastic resins listed above. If a composition comprising an acrylic resin is used in a coverlay film, then a product with particularly superior anti-migration characteristics can be obtained. If a composition comprising either a phenoxy resin or a polyamideimide resin is used in a coverlay film, then the flexibility can be further improved.

Synthetic Rubber

Synthetic rubbers that can be used as an alternative component (B) are typically polymer compounds with a glass transition temperature (Tg) that is less than room temperature (25° C.). There are no particular restrictions on the synthetic rubber, although in those cases where the rubber is blended into a composition that is used in a flexible copper-clad laminate or a coverlay film, from the viewpoint of improving the adhesion between the copper foil and the electrically insulating film comprising a polyimide film or the like, carboxyl group-containing acrylonitrile-butadiene rubbers (hereafter, the term acrylonitrile-butadiene rubber may also be abbreviated as NBR) are preferred.

Examples of these carboxyl group-containing NBR include copolymer rubbers produced by the copolymerization of acrylonitrile and butadiene so that the ratio of the quantity of acrylonitrile relative to the combined quantity of acrylonitrile and butadiene is within a range from 5 to 70% by mass, and preferably from 10 to 50% by mass, in which the molecular chain terminals of the copolymer have been carboxylated, as well as copolymer rubbers of acrylonitrile, butadiene, and a carboxyl group-containing monomer such as acrylic acid or maleic acid. The carboxylation of the molecular chain terminals in the above copolymer rubbers can be conducted using monomers that contain a carboxyl group, such as methacrylic acid or the like.

There are no particular restrictions on the carboxyl group content within the aforementioned carboxyl group-containing NBR, although proportions within a range from 1 to 10% by mass are preferred, and proportions from 2 to 6% by mass are even more desirable. If this proportion falls within this range from 1 to 10% by mass, then the fluidity of the product composition can be controlled, meaning a favorable level of curability can be achieved.

Specific examples of these carboxyl group-containing NBR, listed in terms of their brand names, include Nipol 1072 (manufactured by Zeon Corporation), and the high-purity, low ionic impurity product PNR-1H (manufactured by JSR Corporation). High-purity carboxyl group-containing acrylonitrile butadiene rubbers are very expensive and can therefore not be used in large quantities, although they are effective in simultaneously improving the adhesion and the anti-migration properties.

In addition, in those cases where an adhesive composition of the present invention is used for a coverlay film, joint use of a hydrogenated NBR is also effective. In these synthetic rubbers, the butadiene double bonds within the aforementioned NBR rubbers have been converted to single bonds through hydrogenation, and consequently deterioration of the butadiene rubber component through heat history does not occur. Accordingly, neither deterioration of the peel strength between the adhesive composition and the copper foil as a result of heat history, nor deterioration of the anti-migration characteristics as a result of heating occur. By combining an aforementioned carboxyl group-containing NBR and a hydrogenated NBR, coverlay films and flexible copper-clad laminates with better balance between the various characteristics can be obtained. Specific examples of hydrogenated NBR products include the Zetpol series of products (manufactured by Zeon Corporation).

The thermoplastic resins and synthetic rubbers of the component (B) can be used either alone, or in combinations of two or more different materials. Furthermore, the component (B) may comprise either one of thermoplastic resins or synthetic rubbers, or may combine both types of material.

There are no particular restrictions on the blend quantity (if both a thermoplastic resin and a synthetic rubber are used, then the combined quantity) of the component (B), although the quantity is typically within a range from 10 to 2,500 parts by mass, and preferably from 20 to 300 parts by mass, per 100 parts by mass of the component (A). If the quantity of the component (B) falls within this range from 10 to 2,500 parts by mass, then the produced flexible copper-clad laminate, coverlay film, and adhesive sheet exhibit superior flame retardancy, and superior peel strength from the copper foil.

[Curing Agent (C)]

There are no particular restrictions on the curing agent of the component (C), and any of the materials typically used as epoxy resin curing agents can be used. Examples of the curing agent include polyamine-based curing agents, acid anhydride-based curing agents, boron trifluoride amine complex salts, and phenol resins. Specific examples of polyamine-based curing agents include aliphatic amine-based curing agents such as diethylenetriamine, tetraethylenetetramine, and tetraethylenepentamine; alicyclic amine-based curing agents such as isophorone diamine; aromatic amine-based curing agents such as diaminodiphenylmethane and phenylenediamine; and dicyandiamide. Specific examples of acid anhydride-based curing agents include phthalic anhydride, pyromellitic anhydride, trimellitic anhydride, and hexahydrophthalic anhydride. Of these, from the viewpoint of ensuring a suitable level of reactivity when the product composition is used in a coverlay film, polyamine-based curing agents are preferred, whereas from the viewpoint of imparting a superior level of heat resistance in the case of a flexible copper-clad laminate, acid anhydride-based curing agents are preferred.

The curing agents of the component (C) can be used either alone, or in combinations of two or more different compounds.

There are no particular restrictions on the blend quantity of the component (C), although the quantity is typically within a range from 0.5 to 100 parts by mass, and preferably from 1 to 20 parts by mass, per 100 parts by mass of the component (A).

[Phytate Compound (D)]

The phytate compound of the component (D) is a component for (1) imparting superior flame retardancy (VTM-0) to the cured product with no loss in the solder heat resistance (under normal conditions) of the cured product, or (2) improving the anti-migration properties of the cured product with no loss in the solder heat resistance (under moisture absorption conditions), and usually comprises no halogen atoms.

There are no particular restrictions on the phytate compound of the component (D), and suitable examples include phytin (that is, the calcium and magnesium double salt of phytic acid), phytate salts of metals, including alkali metals (such as sodium and potassium), alkaline earth metals (such as calcium, magnesium and barium),and transition metals (such as iron and zinc), as well as ammonium and amine phytate salts, and of these, sodium phytate, potassium phytate, and calcium phytate are preferred, and calcium phytate is particularly desirable. These phytate compounds may either contain no water of crystallization, or may contain water of crystallization (and may also include a plurality of compounds with different levels of water of crystallization).

The component (D) includes phytate (IP6: inositol hexaphosphate) compounds represented by the structural formula (I) shown below:

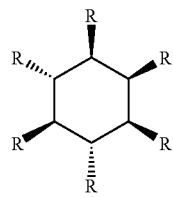

(I)

wherein, R represents a phosphate group represented by the formula shown below:

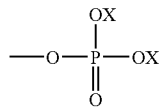

wherein, each X group represents, independently, a member selected from the group consisting of an hydrogen atom, an alkali metal atom, an alkaline earth metal atom, a transition metal atom, an ammonium group, and an amine group, provided that all the 12 X groups within the phytate compound shown above are not a hydrogen atom at the same time. Preferably, of the 12 X groups within the phytate compound shown above, from 3 to 10 X groups are each independently selected from the group consisting of an alkali metal atom, an alkaline earth metal atom, a transition metal atom, an ammonium group, and an amine group, and the rest of the X groups are a hydrogen atom.

Furthermore, components in which the phosphorus content is within a range from 15 to 25% by mass, and particularly from 18 to 25% by mass are preferred as they enable favorable flame retardancy to be realized with smaller blend quantities.

This component can be prepared, for example, by using a basic material such as an alkali metal hydroxide, an alkaline earth metal hydroxide, ammonia, or an amine to neutralize either synthesized phytic acid, or phytic acid prepared by removing metal ions such as calcium and magnesium from the phytin that exists in large quantities in seeds and grains and the like (and particularly in rice bran), and then purifying the crude phytic acid.

This component is insoluble in organic solvents such as methyl ethyl ketone (hereafter also referred to as MEK), toluene, dimethylacetamide and dioxolan typically used in adhesive varnishes, meaning that when used within a coverlay film, this component offers the advantage of being resistant to exudation during heat press curing of the coverlay film.

The phytate compound of the component (D) can be used either alone, or in combinations of two or more different compounds.

There are no particular restrictions on the blend quantity of the component (D), although in order to ensure a favorable level of flame retardancy, the blend quantity relative to 100 parts by mass of the combination of the organic solid components and inorganic solid components within the adhesive composition is preferably within a range from 5 to 50 parts by mass, even more preferably from 7 to 30 parts by mass, and most preferably from 15 to 27 parts by mass.

[Curing Accelerator (E)]

There are no particular restrictions on the curing accelerator of the component (E), provided it accelerates the reaction between the halogen-free epoxy resin (A) and the curing agent (C). Specific examples of this curing accelerator include imidazole compounds such as 2-methylimidazole, 2-ethylimidazole, 2-ethyl-4-methylimidazole, ethyl isocyanate compounds of these compounds, 2-phenylimidazole, 2-phenyl-4-methylimidazole, 2-phenyl-4-methyl-5-hydroxymethylimidazole, and 2-phenyl-4,5-dihydroxymethylimidazole; triorganophosphine compounds such as triphenylphosphine, tributylphosphine, tris(p-methylphenyl)phosphine, tris(p-methoxyphenyl)phosphine, tris(p-ethoxyphenyl)phosphine, triphenylphosphine-triphenylborate, and tetraphenylphosphine-tetraphenylborate; quaternary phosphonium salts; tertiary amines such as triethyleneammonium triphenylborate, and the tetraphenylborates thereof; fluoroborates such as zinc fluoroborate, tin fluoroborate, and nickel fluoroborate; and octylate salts such as tin octylate and zinc octylate.

These curing accelerators of the component (E) can be used either alone, or in combinations of two or more different compounds.

There are no particular restrictions on the blend quantity of the component (E), although the quantity is preferably within a range from 0.1 to 30 parts by mass, even more preferably from 1 to 20 parts by mass, and most preferably from 1 to 5 parts by mass, per 100 parts by mass of the component (A).

[Other Optional Components]

In addition to the components (A) through (E) described above, other optional components may also be added.

Inorganic Fillers

Inorganic fillers can also be added to the composition, in addition to the phytate compound of the component (D). There are no particular restrictions on these inorganic fillers, and any fillers used in conventional adhesive sheets, coverlay films, and flexible copper-clad laminates can be used. Specifically, from the viewpoint of also functioning as a flame retardancy assistant, metal oxides such as aluminum hydroxide, magnesium hydroxide, silicon dioxide, and molybdenum oxide can be used, and of these, aluminum hydroxide and magnesium hydroxide are preferred. These inorganic fillers can be used either alone, or in combinations of two or more different compounds.

There are no particular restrictions on the blend quantity of the above inorganic fillers, although the quantity is preferably within a range from 5 to 60 parts by mass, and even more preferably from 7 to 30 parts by mass, per 100 parts by mass of the combination of the organic solid components and inorganic solid components within the adhesive composition.

Organic Solvents

The components (A) to (E) described above, and any optional components that are added as required, are dissolved or dispersed in an organic solvent to form a dispersion of the composition, which is then used in the production of flexible copper-clad laminates, coverlay films, and adhesive sheets. Examples of suitable organic solvents include N,N-dimethylacetamide, methyl ethyl ketone, N,N-dimethylformamide, cyclohexanone, N-methyl-2-pyrrolidone, toluene, methanol, ethanol, isopropanol, acetone, and dioxolan, and of these, N,N-dimethylacetamide, methyl ethyl ketone, N,N-dimethylformamide, cyclohexanone, N-methyl-2-pyrrolidone, toluene, and dioxolan are preferred, and N,N-dimethylacetamide, methyl ethyl ketone, toluene, and dioxolan are particularly preferred. These organic solvents can be used either alone, or in combinations of two or more different solvents.

The combined concentration of the organic solid components and the inorganic solid components within the dispersion is typically within a range from 10 to 45% by mass, and preferably from 20 to 40% by mass. If this concentration falls within this range from 10 to 45% by mass, then the dispersion exhibits a favorable level of ease of application to substrates such as electrically insulating films, thus providing superior workability, and also offers superior coatability, with no irregularities occurring during coating, while also providing superior performance in terms of environmental and economic factors.

The term "organic solid components" refers to the non-volatile organic components within the adhesive composition of the present invention, and specifically, refers mainly to the components (A) through (E), and any other organic solid components that may be added, and in those cases where the adhesive composition includes an organic solvent, the organic solvent is not included within these organic solid components. Furthermore, the term "inorganic solid components" refers to the non-volatile inorganic solid components within the adhesive composition of the present invention, and specifically, refers to inorganic fillers that may be added to the composition, and other inorganic solid components that may sometimes be added.

The organic solid components within the composition of the present invention, together with any added inorganic solid components and organic solvents, can be mixed together using a pot mill, ball mill, homogenizer, or super mill or the like.

<Coverlay Films>

The composition described above can be used in the production of coverlay films. Specifically, coverlay films having an electrically insulating film, and a layer comprising the above composition provided on top of the film can be produced. As follows is a description of a process for producing such a coverlay film.

A dispersion comprising a composition of the present invention prepared in a liquid form by mixing the required components with an organic solvent is applied to an electrically insulating film using a reverse roll coater or a comma coater or the like. The electrically insulating film with the applied dispersion is then passed through an in-line dryer or the like, and heated at 80 to 160° C. for a period of 2 to 10 minutes, thereby removing the organic solvent and drying the composition to form a semi-cured state, and a roll laminator is then used to crimp and laminate the coated film to a protective layer, thereby forming a coverlay film. The protective layer is peeled off at the time of use. The term "semi-cured state" refers to a state where the composition is dry, and the curing reaction has begun within portions of the composition.

The dried thickness of the coating film of the composition in the above coverlay film is typically within a range from 5 to 45 μm, and preferably from 5 to 35 μm.

Electrically Insulating Film

The above electrically insulating film is used in flexible copper-clad laminates and coverlay films of the present invention. There are no particular restrictions on the electrically insulating film, and any film that is typically used in flexible copper-clad laminates and coverlay films can be used, although in those cases where the film is to be used in a coverlay film, a film that has undergone low temperature plasma treatment is preferred. Specific examples of suitable electrically insulating films include polyimide films, polyethylene terephthalate films, polyester films, polyparabanic acid films, polyetheretherketone films, polyphenylene sulfide films, and aramid films; as well as films produced by impregnating a substrate comprising glass fiber, aramid fiber, or polyester fiber or the like with a matrix such as an epoxy resin, polyester resin, or diallyl phthalate resin, and then forming the impregnated substrate into a film or sheet form. From the viewpoints of achieving favorable heat resistance, dimensional stability, and mechanical characteristics for the produced coverlay film, polyimide films are preferred, and the use of low temperature plasma treated polyimide films within coverlay films is particularly desirable. Any of the polyimide films typically used in coverlay films can be used. The thickness of this electrically insulating film can be set to any desired value, depending on need, although thickness values from 12.5 to 50 μm are preferred.

In a preferred embodiment of the present invention, a low temperature plasma treated polyimide film is used. The low temperature plasma treatment process for the polyimide film is described below. Specifically, the polyimide film is placed inside a low temperature plasma treatment apparatus that is capable of reduced pressure operation, the atmosphere inside the apparatus is replaced with an inorganic gas, and with the internal pressure held within a range from 0.133 to 1,333 Pa, and preferably from 1.33 to 133 Pa, a direct current voltage or alternating current voltage of 0.1 to 10 kV is applied across the electrodes, causing a glow discharge and thereby generating an inorganic gas low temperature plasma, and the film is then moved, while the film surface is subjected to continuous treatment. The treatment time is typically within a range from 0.1 to 100 seconds. Examples of the aforementioned inorganic gas include inert gases such as helium, neon, and argon, as well as oxygen, carbon monoxide, carbon dioxide, ammonia, and air. These inorganic gases can be used either alone, or in combinations of two or more different gases.

This low temperature plasma treatment improves the adhesion between the polyimide film and the adhesive layer formed on top of the film. In those cases where a thermoplastic resin is used as the component (B) in a composition of the present invention, because the glass transition temperature (Tg) of such resins is typically quite high, the adhesion between the polyimide film and the composition of the present invention can sometimes be unsatisfactory. In such cases, the use of a low temperature plasma treated film can improve the adhesion. Furthermore, even in those cases where a synthetic rubber is used as the component (B), low temperature plasma treatment is still advantageous as it further improves the adhesion.

Protective Layer

There are no particular restrictions on the protective layer described above, provided it is able to be peeled off without damaging the state of the adhesive layer, and typical examples of suitable films include plastic films such as polyethylene (PE) films, polypropylene (PP) films, polymethylpentene (TPX) films, and polyester films; and release sheets in which a polyolefin film such as a PE film or PP film, or a TPX film is coated onto one side or both sides of a paper material.

<Adhesive Sheets>

The composition described above can be used in the production of adhesive sheets. Specifically, adhesive sheets having a layer comprising the aforementioned composition, and a protective layer for covering the layer comprising the composition can be produced. This protective layer can use the types of layers described above as protective layers for coverlay films. As follows is a description of a process for producing an adhesive sheet of the present invention.

A dispersion comprising a composition of the present invention prepared in a liquid form by mixing the required components with an organic solvent is applied to a protective layer using a reverse roll coater or a comma coater or the like. The protective layer with the applied dispersion is then passed through an in-line dryer or the like, and heated at 80 to 160° C. for a period of 2 to 10 minutes, thereby removing the organic solvent and drying the composition to form a semi-cured state, and a roll laminator is then used to crimp and laminate the coated layer to another protective layer, thereby forming an adhesive sheet.

<Flexible Copper-Clad Laminates>

The composition described above can be used in the production of flexible copper-clad laminates. Specifically, flexible copper-clad laminates having an electrically insulating film, a layer comprising the above composition provided on top of the film, and copper foil can be produced. The electrically insulating film can use the same types of electrically insulating films described above in the section relating to coverlay films (with polyimide films being preferred), and may also use low temperature plasma treated films. As follows is a description of a process for producing a flexible copper-clad laminate.

A dispersion comprising a composition of the present invention prepared in a liquid form by mixing the required components with an organic solvent is applied to an electrically insulating film using a reverse roll coater or a comma coater or the like. The electrically insulating film with the applied dispersion is then passed through an in-line dryer or the like, and heated at 80 to 160° C. for a period of 2 to 10 minutes, thereby removing the organic solvent and drying the composition to form a semi-cured state, and by subsequently heat laminating this structure (using thermocompression bonding) to a copper foil at 100 to 150° C., a flexible copper-clad laminate is obtained. By subjecting this flexible copper-clad laminate to after-curing, the semi-cured composition is completely cured, yielding the final flexible copper-clad laminate. After-curing is preferably conducted at a temperature within a range from 80 to 160° C.

The dried thickness of the coating film of the composition in the above flexible copper-clad laminate is typically within a range from 5 to 45 μm, and preferably from 5 to 18 μm.

The copper foil described above can use the rolled, electrolytic copper foil product typically used in conventional flexible copper-clad laminates. The thickness of this copper foil is typically within a range from 5 to 70 μm.

EXAMPLES

As follows is a more detailed description of the present invention using a series of examples, although the present invention is in no way limited by the examples presented below. The components (A) through (E), and the other optional components used in the examples are as specified below. The units for the numbers representing the blend proportions in the tables are parts by mass.

<Adhesive Composition Components>

Halogen-Free Epoxy Resins (A)

(1) Epikote 828EL (brand name) (manufactured by Japan Epoxy Resins Co., Ltd., epoxy equivalence: approximately 190, weight average molecular weight: approximately 370, number of epoxy groups per molecule: 2)

(2) Epikote 604 (brand name) (manufactured by Japan Epoxy Resins Co., Ltd., epoxy equivalence: approximately 120, weight average molecular weight: approximately 430, number of epoxy groups per molecule: 4)

(3) EP-49-20 (brand name) (manufactured by Asahi Denka Co., Ltd., epoxy equivalence: 200, weight average molecular weight: no more than 1,000, number of epoxy groups per molecule: at least 2)

(4) EPPN-502H (brand name) (manufactured by Nippon Kayaku Co., Ltd., epoxy equivalence: approximately 170, weight average molecular weight: no more than 1,000, number of epoxy groups per molecule: at least 2)

(5) EOCN-103S (brand name) (manufactured by Nippon Kayaku Co., Ltd., epoxy equivalence: approximately 215, weight average molecular weight: no more than 2,000, number of epoxy groups per molecule: 7 to 9)

(6) YL7175-1000 (brand name) (manufactured by Japan Epoxy Resins Co., Ltd., epoxy equivalence: 1120, weight average molecular weight: at least 2,000, number of epoxy groups per molecule: 2)

Thermoplastic Resins (B-1)

(1) Vylon 237 (brand name) (a phosphorus-containing polyester resin, manufactured by Toyobo Co., Ltd., phosphorus content: 3.1% by mass, number average molecular weight: 25,000)

(2) Vylon 537 (brand name) (a phosphorus-containing polyester resin, manufactured by Toyobo Co., Ltd., phosphorus content: 3.9% by mass, number average molecular weight: 24,000)

(3) SG-708-6T (brand name) (a carboxyl group-containing acrylic resin, manufactured by Nagase ChemteX Corporation, weight average molecular weight: 500,000 to 600,000)

(4) Epikote 1256 (brand name) (a phenoxy resin manufactured by Japan Epoxy Resins Co., Ltd., epoxy equivalence: approximately 8,000, weight average molecular weight: approximately 50,000, number of epoxy groups per molecule: 2)

Synthetic Rubbers (B-2)

(1) Zetpol 2020 (brand name) (a hydrogenated acrylonitrile-butadiene rubber, manufactured by Zeon Corporation, acrylonitrile content: 36% by mass)

(2) PNR-1H (brand name) (a carboxyl group-containing acrylonitrile-butadiene rubber, manufactured by JSR Corporation, acrylonitrile content: 27% by mass, carboxyl group content: 3.5% by mass)

(3) Nipol 1072 (brand name) (a carboxyl group-containing acrylonitrile-butadiene rubber, manufactured by Zeon Corporation, acrylonitrile content: 27% by mass, carboxyl group content: 3.4% by mass)

Curing Agents (C)

(1) EH705A (brand name) (an acid anhydride-based curing agent, manufactured by Asahi Denka Co., Ltd.)

(2) DDS (4,4'-diaminodiphenylsulfone)

Phytate Compounds (D)

(1) Calcium phytate (a compound in which approximately four of the six phosphoric acid groups within phytic acid have formed salts with Ca ions. Available under the brand name "calcium phytin" manufactured by Tsuno Co., Ltd., phosphorus content: 20% by mass)

Curing Accelerators (E)

(1) 2E4MZ-CN (brand name) (an imidazole-based curing accelerator, manufactured by Shikoku Corporation)

(2) $Sn(BF_4)_2$ (Optional) Inorganic Fillers (1) Higilite H43STE (aluminum hydroxide, manufactured by Showa Denko K. K.)

(2) Zinc white (zinc oxide)

(Other) Flame Retardants other than the Component (D)

(1) PX-200 (brand name) (an aromatic condensed phosphate ester represented by a formula: $[OC_6H_3(CH_3)_2]_2P(O)OC_6H_4OP(O)[OC_6H_3(CH_3)_2]_2$, manufactured by Daihachi Chemical Industry Co., Ltd., phosphorus content: 9% by mass)

<Characteristics of Flexible Copper-Clad Laminates>

Example 1

Each of the components of the adhesive composition were combined in the ratios shown in the column labeled example 1 in Table 1, and a mixed solvent of methyl ethyl ketone and dioxolan was then added to the resulting mixture, yielding a dispersion in which the combined concentration of the organic solid components and the inorganic solid components was 35% by mass.

The above dispersion was then applied to the surface of a polyimide film A (brand name: Kapton H, manufactured by DuPont Toray Co., Ltd., thickness: 25 μm) using an applicator, in sufficient quantity to generate a dried coating of thickness 10 μm, and the applied coating was then dried for 10 minutes at 120° C. in a forced air oven, thereby converting the composition to a semi-cured state. The dispersion-coated surface of the polyimide film A and one surface of a rolled copper foil (brand name: BHY22BT, manufactured by Japan Energy Corporation, thickness: 35 μm) were then bonded together by thermocompression bonding using a roll laminator at 120° C. and a linear pressure of 2 kg/cm, and the resulting laminate was then subjected to after-curing for one hour at 80° C., and a further 4 hours at 160° C., thereby completing the preparation of a flexible copper-clad laminate. The characteristics of this flexible copper-clad laminate were measured in accordance with the measurement methods 1 described below. The results are shown in Table 1.

Example 2

With the exception of combining each of the components of the adhesive composition in the ratios shown in the column labeled example 2 in Table 1, a flexible copper-clad laminate was prepared in the same manner as the example 1. The characteristics of this flexible copper-clad laminate were also measured in accordance with the measurement methods 1 described below. The results are shown in Table 1.

Comparative Examples 1 and 2

With the exception of combining each of the components of the adhesive composition in the ratios shown in the columns labeled comparative example 1 and 2 respectively in Table 1, flexible copper-clad laminates were prepared in the same manner as the example 1. The characteristics of these flexible copper-clad laminates were also measured in accordance with the measurement methods 1 described below. The results are shown in Table 1.

[Measurement Methods 1]

1-1. Peel Strength

The peel strength was measured in accordance with JIS C6481, by forming a circuit with a pattern width of 1 mm on the flexible copper-clad laminate, and then measuring the minimum value for the force required to peel the copper foil (the aforementioned circuit) at a speed of 50 mm/minute in a direction at an angle of 90 degrees to the surface of the laminate under conditions at 25° C., and this measured value was used as the peel strength.

1-2. Solder Heat Resistance (Normal Conditions)

The solder heat resistance was measured in accordance with JIS C6481, by preparing test specimens by cutting 25 mm squares from the flexible copper-clad laminate, and then floating these test specimens for 30 seconds on a solder bath at a fixed temperature. The temperature of the solder bath was then varied, and the maximum temperature for which no blistering, peeling, or discoloration of the test specimen occurred was measured.

1-3. Flame Retardancy

A sample was first prepared by removing the entire copper foil from the flexible copper-clad laminate using an etching treatment. The flame retardancy of this sample was then measured in accordance with the flame retardancy standard UL94VTM-0. If the sample satisfied the flame retardancy requirements of UL94VTM-0 it was evaluated as "good", and was recorded using the symbol o, whereas if the sample combusted, it was evaluated as "poor", and was recorded using the symbol x.

TABLE 1

| | Components | Brand name | Example 1 | Example 2 | Comparative Example 1 | Comparative Example 2 |
|---|---|---|---|---|---|---|
| A | Halogen-free epoxy resin | Epikote 828EL | 40 | 30 | 40 | 30 |
| | | Epikote 604 | 40 | 45 | 40 | 45 |
| B | Thermoplastic resin | Vylon 237 | — | 100 | — | 100 |
| | | Vylon 537 | 100 | — | 100 | — |
| C | Curing agent | EH705A | 9 | 8 | 9 | 8 |
| D | Phytate compound | Calcium phytin | 10 | 12 | — | — |
| E | Curing accelerator | 2E4MZ-CN | 5 | 4 | 5 | 4 |
| optional | Inorganic filler | Higilite H43STE | 20 | 20 | 20 | 20 |
| other | Flame retardant other than component (D) | PX-200 | — | — | 22 | 28 |
| | Characteristics | (Units) | | | | |
| | Peel strength | N/cm | 11 | 10 | 9 | 5 |
| | Solder heat resistance (normal conditions) | ° C. | 370 | 370 | 330 | 320 |
| | Flame retardancy (UL94VTM-0) | | ○ | ○ | ○ | ○ |

<Characteristics of Coverlay Films>

Examples 3 to 6

With the exception of combining each of the components of the adhesive composition in the ratios shown in the columns labeled example 3 through 6 respectively in Table 2, dispersions were prepared in the same manner as the example 1. Meanwhile, one side of a polyimide film B (brand name: Apical NPI, manufactured by Kanegafuchi Chemical Industry Co., Ltd., thickness: 25 μm) was subjected to low temperature plasma treatment under predetermined conditions (pressure: 13.3 Pa, argon flow rate: 1.0 L/minute, applied voltage 2 kV, frequency: 110 kHz, power: 30 kW, treatment speed: 10 m/minute). Subsequently, an applicator was used to apply each dispersion described above to the low temperature plasma treated surface of a polyimide film, in sufficient quantity to generate a dried coating of thickness 25 μm, and the applied coating was then dried for 10 minutes at 90° C. in a forced air oven, thereby converting the composition to a semi-cured state, and forming a coverlay film. The characteristics of each coverlay film were then measured in accordance with the measurement methods 2 described below. The results are shown in Table 2.

Comparative Examples 3 and 4

With the exception of combining each of the components of the adhesive composition in the ratios shown in the columns labeled comparative example 3 and 4 respectively in Table 2, coverlay films were prepared in the same manner as the example 3. The characteristics of these coverlay films were also measured in accordance with the measurement methods 2 described below. The results are shown in Table 2.

Comparative Example 5

With the exceptions of combining each of the components of the adhesive composition in the ratios shown in the column labeled comparative example 5 in Table 2, and using a polyimide film B that had not undergone low temperature plasma treatment, a coverlay film was prepared in the same manner as the example 3. The characteristics of this coverlay film were also measured in accordance with the measurement methods 2 described below. The results are shown in Table 2.

[Measurement Methods 2]

2-1. Peel Strength

The peel strength was measured in accordance with JIS C6481, by first preparing a pressed sample by bonding the adhesive layer of the coverlay film to the glossy surface of an electrolytic copper foil of thickness 35 μm (manufactured by Japan Energy Corporation) using a press device (temperature: 160° C., pressure: 50 kg/cm$^2$, time: 40 minutes). The prepared pressed sample was then cut to form a test specimen with dimensions of width 1 cm and length 15 cm, the polyimide film surface of this test specimen was secured, and the minimum value for the force required to peel the copper foil at a speed of 50 mm/minute in a direction at an angle of 90 degrees to the polyimide film surface under conditions at 25° C. was then measured, and this measured value was used as the peel strength.

2-2. Solder Heat Resistance (Normal Conditions, Moisture Absorption)

With the exception of preparing the test specimens by cutting 25 mm square samples from the pressed sample of the coverlay film prepared for the aforementioned peel strength measurement, the solder heat resistance (normal conditions) was measured in the same manner as that described in the above measurement method 1-2.

In addition, the solder heat resistance (moisture absorption) was also measured by preparing similar test specimens to those prepared for the measurement of the solder heat resistance (normal conditions), subsequently leaving the test specimens to stand for 24 hours in an atmosphere at a temperature of 40° C. and a humidity of 90%, and then floating these test specimen for 30 seconds on a solder bath at a fixed temperature. The temperature of the solder bath was then varied, and the maximum temperature for which no blistering, peeling, or discoloration of the test specimen occurred was measured.

2-3. Flame Retardancy

Using a press device (temperature: 160° C., pressure: 50 kg/cm$^2$, time: 40 minutes), pressed samples were first prepared by bonding each of the coverlay films obtained in the examples 3 to 6 to the adhesive layer of a sample produced by removing the entire copper foil from a flexible copper-clad laminate of the example 2 using an etching treatment. Furthermore, using a similar method, pressed samples were also prepared by bonding each of the coverlay films obtained in the comparative examples 3 to 5 to a sample produced by removing the entire copper foil from a flexible copper-clad laminate of the comparative example 2 using an etching treatment. These pressed samples were evaluated for flame retardancy (as a combination of a coverlay film and a flexible copper-clad laminate) in the same manner as that described in the above measurement method 1-3.

2-4. Anti-Migration Characteristics

Using a press device (temperature: 160° C., pressure: 50 kg/cm$^2$, time: 40 minutes), samples for evaluation were prepared by bonding each of the coverlay films obtained in the examples 3 to 6 to a substrate comprising a flexible copper-clad laminate obtained in the example 1 with a comb-shaped circuit of pitch 160 μm (line/space=80 μm/80 μm) printed thereon (in other words, a substrate in which the copper foil of the copper-clad laminate has undergone etching treatment to form a comb-shaped circuit). Furthermore, using a similar method, samples for evaluation were also prepared by bonding each of the coverlay films obtained in the comparative examples 3 to 5 to a substrate comprising a flexible copper-clad laminate obtained in the comparative example 1 with a comb-shaped circuit of pitch 160 μm (line/space=80 μm/80 μm) printed thereon. Under conditions including a temperature of 85° C. and a humidity of 85%, a migration tester (brand name: MIG-86, manufactured by IMV Corporation) was used to apply a voltage of 50 V across the terminals of the circuit of each of these samples for evaluation, and after 1,000 hours, those samples for which the resistance across the circuit was at least 10 MΩ were evaluated as "good", and were recorded using the symbol o, whereas those samples for which the resistance was less than 10 MΩ were evaluated as "poor", and were recorded using the symbol x.

TABLE 2

| | <Components> | (Brand name) | Example 3 | Example 4 | Example 5 | Example 6 | Comparative Example 3 | Comparative Example 4 | Comparative Example 5 |
|---|---|---|---|---|---|---|---|---|---|
| A | Halogen-free epoxy resin | Epikote 828EL | 20 | 30 | 20 | 25 | 20 | 20 | 25 |
| | | EP-49-20 | 20 | — | 20 | 25 | 20 | 20 | 25 |
| | | EPPN-502H | 40 | — | 40 | — | 40 | 40 | — |
| | | EOCN-103S | 20 | — | 20 | 50 | 20 | 20 | 50 |
| | | YL7175-1000 | — | 20 | — | — | — | — | — |
| B | 1 Thermoplastic resin | SG-708-6T | — | — | 100 | 150 | — | 100 | 150 |
| | | Epikote 1256 | — | 100 | — | — | — | — | — |
| | 2 Synthetic rubber | Zetpol 2020 | 5 | — | — | — | 5 | — | — |
| | | PNR-1H | 30 | 50 | — | — | 30 | — | — |
| C | Curing agent | DDS | 12 | 12 | 9 | 11 | 12 | 9 | 11 |
| D | Phytate compound | Calcium phytin | 15 | 25 | 25 | 30 | — | — | — |
| E | Curing accelerator | 2E4MZ-CN | — | 3 | — | — | — | — | — |
| | | Sn(BF$_4$)$_2$ | 1 | — | 1.5 | 1.5 | 1 | 1.5 | 1.5 |
| optional | Inorganic filler | Higilite H43STE | 20 | 35 | 30 | 30 | 20 | 30 | 30 |
| | | Zinc oxide | 2 | 1 | — | — | 2 | — | — |
| other | Flame retardant other than component (D) | PX-200 | — | — | — | — | 33 | 55 | 55 |
| | Polyimide film plasma treatment | | yes | yes | yes | yes | yes | yes | no |
| <Characteristics> | | (Units) | | | | | | | |
| | Peel strength | N/cm | 10 | 8 | 8 | 10 | 6 | 6 | 4 |
| | Solder heat resistance (normal conditions) | °C. | 330 | 330 | 320 | 320 | 300 | 300 | 300 |
| | Solder heat resistance (moisture absorption) | °C. | 270 | 260 | 270 | 270 | 250 | 250 | <250 |
| | Flame retardancy (UL94VTM-0) | | ◯ | ◯ | ◯ | ◯ | ◯ | ◯ | ◯ |
| | Anti-migration characteristics | | ◯ | ◯ | ◯ | ◯ | X | X | X |

<Characteristics of Adhesive Sheets>

Example 7

With the exception of combining each of the components of the adhesive composition in the ratios shown in the column labeled example 7 in Table 3, a dispersion was prepared in the same manner as the example 1. Subsequently, an applicator was used to apply the dispersion to the surface of a polyester film of thickness 25 μm that had been coated with a silicone release agent, in sufficient quantity to generate a dried coating of thickness 25 μm, and the applied coating was then dried for 10 minutes at 90° C. in a forced air oven, thereby converting the composition to a semi-cured state, and forming an adhesive sheet. The characteristics of this adhesive sheet were then measured in accordance with the measurement methods 3 described below. The results are shown in Table 3.

Comparative Example 6

With the exception of combining each of the components of the adhesive composition in the ratios shown in the column labeled comparative example 6 in Table 3, an adhesive sheet was prepared in the same manner as the example 7. The characteristics of this adhesive sheet were also measured in accordance with the measurement methods 3 described below. The results are shown in Table 3.

[Measurement Methods 3]

3-1. Peel Strength

With the exception of preparing the pressed sample by using a press device (temperature: 160° C., pressure: 50 kg/cm², time: 40 minutes) to bond an aforementioned polyimide film B to the glossy surface of an electrolytic copper foil (manufactured by Japan Energy Corporation, thickness: 35 μm), with the adhesive sheet from which the protective layer had been removed disposed therebetween, the peel strength was measured in the same manner as that described in the above measurement method 2-1.

3-2. Solder Heat Resistance (Normal Conditions, Moisture Absorption)

With the exception of preparing the test specimens by cutting 25 mm square samples from the adhesive sheet pressed sample prepared for the above peel strength measurement, the solder heat resistance (under both normal conditions and moisture absorption) was measured in the same manner as that described in the above measurement method 2-2.

3-3. Flame Retardancy

A pressed sample was first prepared by sandwiching an adhesive sheet of the example 7 from which the protective layer had been removed between a sample produced by using an etching treatment to remove the entire copper foil from a flexible copper-clad laminate obtained in the example 2, and an aforementioned polyimide film B, and then bonding the layers together using a press device (temperature: 160° C., pressure: 50 kg/cm², time: 30 minutes). Furthermore, using a similar method, a pressed sample was also prepared by sandwiching an adhesive sheet of the comparative example 6 from which the protective layer had been removed between a sample produced by using an etching treatment to remove the entire copper foil from a flexible copper-clad laminate obtained in the comparative example 2, and an aforementioned polyimide film B, and then bonding the layers together. These pressed samples were evaluated for flame retardancy (as a combination of a flexible copper-clad laminate, an adhesive sheet, and a polyimide film) in the same manner as that described in the above measurement method 2-3.

TABLE 3

| <Components> | | (Brand name) | Example 7 | Comparative Example 6 |
|---|---|---|---|---|
| A | Halogen-free epoxy resin | Epikote 828EL | 50 | 50 |
| B | 1 Thermoplastic resin | Epikote 1256 | 100 | 100 |
|   | 2 Synthetic rubber | Nipol 1072 | 45 | 45 |
| C | Curing agent | DDS | 12 | 12 |
| D | Phytate compound | Calcium phytin | 25 | — |
| E | Curing accelerator | 2E4MZ-CN | 3 | 3 |
| optional | Inorganic filler | Higilite H43STE | 35 | 35 |
|   |   | Zinc oxide | 1 | 1 |
| other | Flame retardant other than component (D) | PX-200 | — | 55 |
| <Characteristics> | | (Units) | | |
| Peel strength | | N/cm | 10 | 6 |
| Solder heat resistance (normal conditions) | | °C. | 330 | 300 |
| Solder heat resistance (moisture absorption) | | °C. | 280 | 250 |
| Flame retardancy (UL94VTM-0) | | | ○ | ○ |

<Evaluation>

The compositions prepared in the examples 1 and 2 satisfy the requirements of the present invention, and flexible copper-clad laminates produced using these compositions exhibited excellent peel strength, solder heat resistance, and flame retardancy. The compositions prepared in the comparative examples 1 and 2 did not include the phytate compound (D), and the resulting flexible copper-clad laminates exhibited inferior performance for at least one of the characteristics of peel strength and solder heat resistance, when compared with the flexible copper-clad laminates that satisfy the requirements of the present invention.

The compositions prepared in the examples 3 to 6 satisfy the requirements of the present invention, and coverlay films produced using these compositions exhibited excellent peel strength, solder heat resistance, flame retardancy, and anti-migration characteristics. The compositions prepared in the comparative examples 3 to 5 did not include the phytate compound (D), and the resulting coverlay films exhibited inferior performance for at least one of the characteristics of peel strength, solder heat resistance, and anti-migration characteristics, when compared with the coverlay films that satisfy the requirements of the present invention.

The composition prepared in the example 7 satisfies the requirements of the present invention, and an adhesive sheet produced using this composition exhibited excellent peel strength, solder heat resistance, and flame retardancy. The composition prepared in the comparative example 6 did not include the phytate compound (D), and the adhesive sheet produced using this composition exhibited inferior performance in terms of peel strength and solder heat resistance when compared with the adhesive sheet that satisfies the requirements of the present invention.

INDUSTRIAL APPLICABILITY

A cured product produced by curing a flame retardant adhesive composition of the present invention, together with a coverlay film, an adhesive sheet, and a flexible copper-clad laminate produced using such a composition, all exhibit excellent flame retardancy, peel strength, electrical characteristics (anti-migration characteristics), and solder heat resistance, and are also halogen-free, meaning they offer considerable promise in applications such as the production of environmentally friendly flexible printed wiring boards.

What is claimed is:

1. A coverlay film, having an electrically insulating film, a layer of a semi-cured product of a flame retardant adhesive composition, and a protective layer, wherein said composition is applied to a surface of said electrically insulating film to form a coated surface, said coated surface further bonded to a side of said protective layer to form said coverlay film; wherein said flame retardant adhesive composition comprises:

(A) a halogen-free epoxy resin;
(B) a thermoplastic resin, a synthetic rubber, or a combination thereof;
(C) a curing agent;
(D) a phytate compound; and
(E) a curing accelerator.

2. The coverlay film according to claim 1, wherein said component (B) of the flame retardant adhesive composition is at least one polymer compound selected from the group consisting of a polyester resin, an acrylic resin, a phenoxy resin, and a carboxyl group-containing acrylonitrile butadiene rubber.

3. The coverlay film according to claim 1, wherein said component (D) of the flame retardant adhesive composition is calcium phytate.

4. The coverlay film according to claim 1, wherein said component (D) of the flame retardant adhesive composition is a phytate compound represented by formula (I):

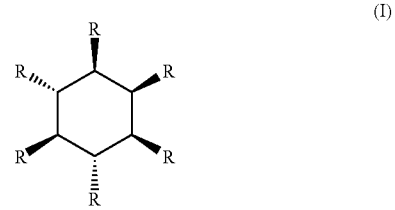

(I)

wherein, R represents a phosphate group represented by:

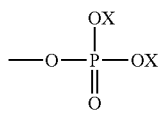

wherein, each X group represents, independently, a member selected from the group consisting of a hydrogen atom, an alkali metal atom, an alkaline earth metal atom, a transition metal atom, an ammonium group, and an amine group, provided that all 12 X groups within the phytate compound represented by formula (I) are not a hydrogen atom at the same time.

5. The coverlay film according to claim 4, wherein, of the 12 X groups within the phytate compound represented by formula (I), from 3 to 10 X groups are each independently selected from the group consisting of an alkali metal atom, an alkaline earth metal atom, a transition metal atom, an ammonium group, and an amine group, and the remaining X groups are a hydrogen atom.

6. The coverlay film according to claim 1, wherein a phosphorus content of said component (D) of the flame retardant adhesive composition is within a range from 15 to 25% by mass, relative to the mass of said component (D).

7. The coverlay film according to claim 1, wherein said component (D) of the flame retardant adhesive composition is present in an amount ranging from 5 to 50 parts by mass, relative to 100 parts by mass of the combination of said components (A) through (E).

8. The coverlay film according to claim 1, wherein the resin of said component (A) of the flame retardant adhesive composition comprises on average at least two epoxy groups.

9. The coverlay film according to claim 1, wherein said component (A) of the flame retardant adhesive composition is selected from the group consisting of a bisphenol A epoxy resin, a bisphenol F epoxy resin, a phenol novolac epoxy resin, and a cresol novolac epoxy resin.

10. The coverlay film according to claim 1, wherein said component (B) of the flame retardant adhesive composition is present in an amount ranging from 10 to 2,500 parts by mass, relative to 100 parts by mass of component (A).

11. The coverlay film according to claim 1, wherein said component (C) of the flame retardant adhesive composition is selected from the group consisting of diethylenetriamine, tetraethylenetetramine, tetraethylenepentamine, isophorone diamine, diaminodiphenylmethane, phenylenediamine, and dicyandiamide.

12. The coverlay film according to claim 11, wherein said component (C) of the flame retardant adhesive composition is present in amount ranging from 0.5 to 100 parts by mass per 100 parts by mass of component (A).

13. The coverlay film according to claim 1, wherein said component (D) of the flame retardant adhesive composition is present in an amount ranging from 15 to 27 parts per mass, relative to 100 parts by mass of the combination of said components (A) through (E).

14. The coverlay film according to claim 1, wherein said component (E) of the flame retardant adhesive composition is selected from the group consisting of 2-methylimidazole, 2-ethylimidazole, 2-ethyl-4-methylimidazole, 2-phenylimidazole, 2-phenyl-4-methylimidazole, 2-phenyl-4-methyl-5-hydroxymethylimidazole, 2-phenyl-4, 5-dihydroxymethylimidazole, triphenyiphosphine, tributyiphosphine, tris(p-methylphenyl)phosphine, tris(p-methoxyphenyl)phosphine, tris(p-ethoxyphenyl)phosphine, triphenyiphosphine-triphenylborate, tetraphenyiphosphine-tetraphenylborate, triethyleneammonium triphenylborate, zinc fluoroborate, tin fluoroborate, nickel fluoroborate, tin octylate, and zinc octylate.

15. The coverlay film according to claim 14, wherein said component (E) of the flame retardant adhesive composition is present in an amount ranging from 0.1 to 30 parts by mass per 100 parts by mass of component (A).

16. The coverlay film according to claim 1, wherein said electrically insulating film is a polyimide film.

17. A process for producing the coverlay film of claim 1, said process comprising:
    applying to said electrically insulating film a dispersion comprising said flame retardant adhesive composition and an organic solvent,
    removing said organic solvent to dry said composition and to form a layer of a semi-cured product of said composition,
    crimping and laminating said layer of a semi-cured product to said protective layer, thereby forming said coverlay film.

18. An adhesive sheet, having a first protective layer, a layer of a semi-cured product of a flame retardant adhesive composition, and a second protective layer, wherein said composition is applied to a surface of said first protective layer to form a coated surface, said coated surface further bonded to a side of said second protective layer to form said adhesive sheet; wherein said flame retardant adhesive composition comprises:
    (A) a halogen-free epoxy resin;
    (B) a thermoplastic resin, a synthetic rubber, or a combination thereof;
    (C) a curing agent;
    (D) a phytate compound; and
    (E) a curing accelerator.

19. A process for producing the adhesive sheet of claim 18, said process comprising:
    applying to said first protective layer a dispersion comprising said flame retardant adhesive composition and an organic solvent,
    removing said organic solvent to dry said composition and to form a layer of a semi-cured product of said composition,
    crimping and laminating said layer of a semi-cured product to said second protective layer, thereby forming said adhesive sheet.

20. A flexible copper-clad laminate, having an electrically insulating film, a layer of a semi-cured or completely cured product of a flame retardant adhesive composition, and copper foil, wherein said composition is applied to a surface of said electrically insulating film to form a coated surface, said coated surface further bonded to a side of said copper film to form said laminate; wherein said flame retardant adhesive composition comprises:
- (A) a halogen-free epoxy resin;
- (B) a thermoplastic resin, a synthetic rubber, or a combination thereof;
- (C) a curing agent;
- (D) a phytate compound; and
- (E) a curing accelerator.

21. The flexible copper-clad laminate according to claim 20, wherein said electrically insulating film is a polyimide film.

22. A process for producing the flexible copper-clad laminate of claim 20, said process comprising:

applying to said electrically insulating film a dispersion comprising said flame retardant adhesive composition and an organic solvent, removing said organic solvent to dry said composition and to form a layer of a semi-cured product of said composition, laminating said layer of a semi-cured product to said copper foil, thereby forming said flexible copper-clad laminate; and optionally after-curing said flexible copper-clad laminate to completely cure said semi-cured product of said composition.

* * * * *